US011182514B2

(12) United States Patent
Freely et al.

(10) Patent No.: US 11,182,514 B2
(45) Date of Patent: Nov. 23, 2021

(54) FACILITATING INTRODUCING KNOWN AMOUNTS OF VARIATION INTO SETS OF KITTED COMPONENTS

(71) Applicant: General Electric Company, Schenectady, NY (US)

(72) Inventors: Brendan Michael Freely, Cincinnati, OH (US); Kevin Klasing, Springboro, OH (US); Eric Ruggiero, West Chester, OH (US); Daniel Endecott Osgood, Cincinnati, OH (US)

(73) Assignee: General Electric Company, Schenectady, NY (US)

( * ) Notice: Subject to any disclaimer, the term of this patent is extended or adjusted under 35 U.S.C. 154(b) by 917 days.

(21) Appl. No.: 15/861,647

(22) Filed: Jan. 3, 2018

(65) Prior Publication Data

US 2019/0205500 A1 Jul. 4, 2019

(51) Int. Cl.
| | | |
|---|---|---|
| *G06F 17/10* | (2006.01) | |
| *G06F 30/15* | (2020.01) | |
| *G06Q 10/06* | (2012.01) | |
| *G06Q 10/00* | (2012.01) | |
| *G06Q 50/04* | (2012.01) | |

(52) U.S. Cl.
CPC ............ *G06F 30/15* (2020.01); *G06Q 10/06* (2013.01); *G06Q 10/0635* (2013.01); *G06Q 10/20* (2013.01); *G06Q 50/04* (2013.01); *F05D 2220/32* (2013.01); *F05D 2230/60* (2013.01)

(58) Field of Classification Search
CPC .... G06F 30/15; G06Q 10/06; G06Q 10/0635; G06Q 10/20; G06Q 50/04

USPC .......................................................... 703/1
See application file for complete search history.

(56) References Cited

U.S. PATENT DOCUMENTS

| | | | |
|---|---|---|---|
| 5,412,576 A | 5/1995 | Hansen | |
| 6,278,920 B1 * | 8/2001 | Hebberd | G06Q 10/06 701/29.3 |
| 7,457,762 B2 | 11/2008 | Wetzer et al. | |
| 7,747,340 B2 | 6/2010 | Jones | |
| | (Continued) | | |

FOREIGN PATENT DOCUMENTS

CN       103268538       8/2013

OTHER PUBLICATIONS

Communication pursuant to Article 94(3) EPC received for EP Patent Application Serial No. 18214619.1 dated Feb. 15, 2021, 9 pages.

(Continued)

*Primary Examiner* — Andre Pierre Louis
(74) *Attorney, Agent, or Firm* — Fitch, Even, Tabin & Flannery, LLP

(57) ABSTRACT

Systems, computer-implemented methods and/or computer program products that facilitate selecting components for aviation engines. In one embodiment, a computer-implemented method comprises: calculating, by a system operatively coupled to a processor, standard deviation between components for aviation engines based on a statistical distribution of measured manufacturing characteristics; selecting, by the system, a subset of components based on the calculated standard deviation; and analyzing, by the system, the subset of components at respective standard deviation to determine a standard deviation and period of time for trading that maximizes durability performance.

20 Claims, 10 Drawing Sheets

(56) References Cited

U.S. PATENT DOCUMENTS

| | | | |
|---|---|---|---|
| 7,937,176 | B2 | 5/2011 | Knipfer et al. |
| 8,478,649 | B2 | 7/2013 | Von Helmolt et al. |
| 9,680,343 | B2 | 6/2017 | Draina et al. |
| 2008/0154458 | A1 | 6/2008 | Brandstetter et al. |
| 2010/0042516 | A1 | 2/2010 | Knipfer et al. |
| 2010/0125354 | A1 | 5/2010 | Knipfer et al. |
| 2017/0107833 | A1* | 4/2017 | Brewer ............ F01D 9/023 |
| 2017/0323274 | A1* | 11/2017 | Johnson .......... G05B 23/0251 |
| 2017/0369190 | A1* | 12/2017 | Ethington ........ B64D 45/00 |
| 2019/0156298 | A1* | 5/2019 | Ethington ........ G06N 7/005 |

OTHER PUBLICATIONS

Hagmark, P. et al. | "Specification and allocation of reliability and availability requirements", Reliability and Maintainability Symposium, 2006. RAMS '06. Annual Newport Beach, CA, USA Jan. 23-26, 2006, Jan. 1, 2006 (Jan. 1, 2006), pp. 304-309, XP055573525, DOI: 10.1109/RAMS.2006.1677391, ISBN 978-1-4244-0007-2.

Youngblood, W. A. | "Technical Note on the Statistics Involved in Availability Calculations", Nov. 11, 1978 (Nov. 11, 1978), pp. 1-8, XP055573513, Austin, Texas. Retrieved from the Internet: URL:https://apps.dtic.mil/dtic/tr/fulltext/u2/a032024.pdf [retrieved on Mar. 25, 2019].

\* cited by examiner

FACILITATING INTRODUCING KNOWN AMOUNTS OF VARIATION INTO SETS OF KITTED COMPONENTS

BACKGROUND

The subject disclosure relates to facilitating introducing known amounts of variation into sets of kitted components, and more specifically, automatically facilitating selecting components for aviation engines.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments herein, devices, systems, computer-implemented methods, apparatus and/or computer program products that facilitate selecting components for aviation engines.

According to one embodiment, a system facilitating selecting components for aviation engines is provided. The system can comprise a memory that stores computer executable components. The system can also comprise a processor, operably coupled to the memory, and that can execute computer executable components stored in the memory. The computer executable components can comprise a calculation component that calculates standard deviation between components for the aviation engines based on a statistical distribution of measured manufacturing characteristics. The computer executable components can further comprise a selection component that selects a subset of components based on the calculated standard deviation. The computer executable components can further comprise an analysis component that analyzes the subset of components at respective standard deviation to determine a standard deviation and period of time for trading that maximizes durability performance.

According to another embodiment, a computer-implemented method is provided. The computer-implemented method can comprise calculating, by a system operatively coupled to a processor, standard deviation between components for aviation engines based on a statistical distribution of measured manufacturing characteristics. The computer-implemented method can further comprise selecting, by the system, a subset of components based on the calculated standard deviation. The computer-implemented method can further comprise analyzing, by the system, the subset of components at respective standard deviation to determine a standard deviation and period of time for trading that maximizes durability performance.

According to another embodiment, a computer program product facilitating selecting components for aviation engines is provided. The computer program product can comprise a computer readable storage medium having program instructions embodied therewith. The program instructions can be executable by a processor to cause the processor to calculate standard deviation between components for the aviation engines based on a statistical distribution of measured manufacturing characteristics. The program instructions can further be executable by a processor to cause the processor to select a subset of components based on the calculated standard deviation. The program instructions can further be executable by a processor to cause the processor to analyze the subset of components at respective standard deviation to determine a standard deviation and period of time for trading that maximizes durability performance.

DETAILED DESCRIPTION

Figure 1:
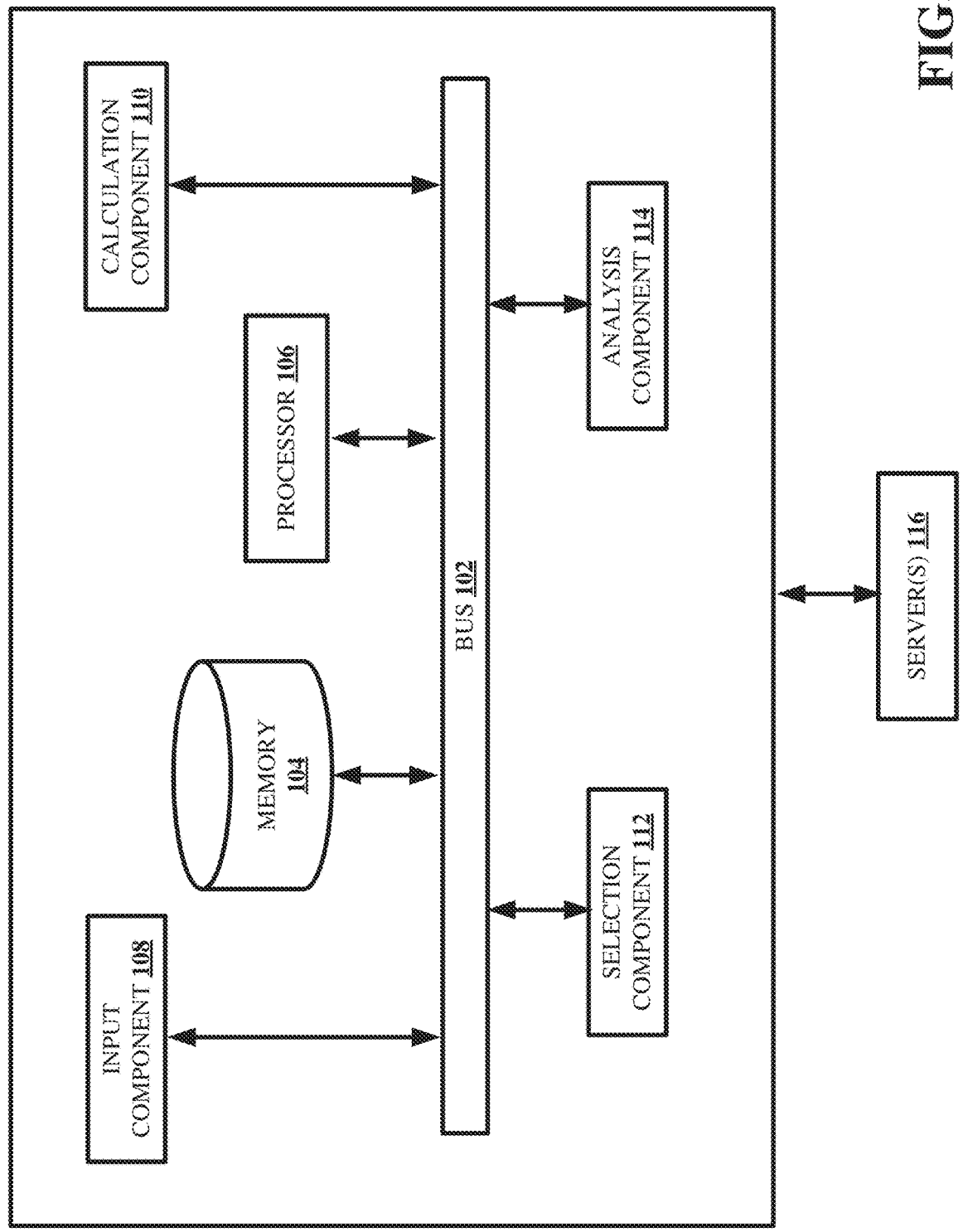
FIG. 1 illustrates a block diagram of an example, non-limiting system facilitating selecting components for aviation engines in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

One or more embodiments described herein utilize an algorithm (e.g., kitting algorithm) designed to be used in tandem with intelligent kitting of gas turbine hot section parts such as the high pressure turbine stage 1 blades (HPT S1Bs) to maximize durability performance and avoid unscheduled downtime. As used herein, kitting and intelligent kitting are used interchangeably to mean intelligent kitting unless another type of kitting is specified. Kitting is the process of grouping, organizing or selecting components or parts such as that of an aviation engine to be placed into kits (e.g., subsets of components). As used herein, the term "components" and "parts" can be used interchangeably to mean components or parts of an aviation engine. The kits can be used to fulfill production orders, and the parts from the kits can be assembled to build products. The kits can also be used for the maintenance, repair and overhaul (MRO) of an aviation engine. The embodiments herein describe kitting thermally life-limited aerospace components into engine sets (e.g., kits). More specifically, the kitting can be based on measurements relevant to the component's thermal life expectancy. It is appreciated that the kitting can be employed for objectives other than thermal life expectancy such as optimal stage efficiency or mechanical robustness.

The algorithm can select the components for aviation engines based on measured manufacturing characteristics such as thermal barrier coating (TBC) thickness, blade airflow and wall thickness. The algorithm can make trades and swap components between similar kits based on a normal statistical distribution to introduce variation into the kits in order to avoid unforeseen downstream effects of creating sets of blades too similar. For example, a swapping of a component from one kit with another kit that is one standard deviation away can be 68% of the time. In another example, a swapping of a component between kits that are two standard deviations away can be 28% of the time. The algorithm can introduce a known amount of variation into sets of kitted components while still using the most similar components possible. This is done to avoid unforeseen downstream effects of creating sets of blades too similar. The amount of variation can be set anywhere between 0 and 100. A variation of 0 is considered as "chunking" the most similar components together. A variation of 100 is considered as completely random kitting.

FIG. 1 illustrates a block diagram of an example, non-limiting system 100 that can facilitate selecting components for aviation engines in accordance with one or more embodiments described herein. Aspects of systems (e.g., system 100 and the like), apparatuses or processes explained in this disclosure can constitute one or more machine-executable components embodied within one or more machines, e.g., embodied in one or more computer readable mediums (or media) associated with one or more machines. Such components, when executed by the one or more machines, e.g., computers, computing devices, virtual machines, etc., can cause the machines to perform the operations described.

In various embodiments, the system 100 can be any type of component, machine, device, facility, apparatus, and/or instrument that comprises a processor. In some embodiments, the system 100 is capable of effective and/or operative communication with a wired and/or wireless network. Components, machines, apparatuses, devices, facilities, and/or instrumentalities that can comprise the system 100 can include, but are not limited to, tablet computing devices, handheld devices, server class computing machines and/or databases, laptop computers, notebook computers, desktop computers, cell phones, smart phones, consumer appliances and/or instrumentation, industrial and/or commercial devices, digital assistants, multimedia Internet enabled phones, multimedia players, and the like.

As illustrated in FIG. 1, the system 100 can comprise bus 102, memory 104, processor 106, input component 108, calculation component 110, selection components 112, analysis component 114 and/or one or more servers 116. The bus 102 can provide for interconnection of various components of the system 100. The memory 104 and processor 106 can carry out computation and/or storage operations of the system 100 as described herein. It is to be appreciated that in some embodiments one or more system components can communicate wirelessly with other components, through a direct wired connection or integrated on a chipset.

In another aspect, the system 100 can be in communication with one or more servers 116. Communications can be facilitated via a wired (including optical fiber) and/or wireless technology. The one or more servers 116 can comprise one or more server data stores that can be employed to store information local to the one or more servers 116. In one implementation, the one or more servers' 116 data stores can contain one or more entries, the entry can relate to information such as thermal barrier coating thickness, blade airflow (e.g., airflow), wall thickness, standard deviation and period of time for trading, for example.

In one or more embodiments described herein of system 100, predictive analytics can be used to automatically generate one or more models of the subset of components for aviation engines used by the system 100 to facilitate automatically generating the standard deviation between the kits and the period of time for trading that maximizes durability performance. For example, the automatic generation can be based on information retained in a knowledgebase. As used herein, the term "knowledgebase" can be a database or other storage location or repository that can store one or more types of information. All such embodiments are envisaged.

The knowledgebase can comprise information related to the standard deviation between the subsets of components and the period of time for trading that maximizes durability performance. In some embodiments, the information related to the standard deviation between the subsets of components and the period of time for trading that maximizes durability performance can be gathered over time and retained in the knowledgebase. In some embodiments, the information gathered can include measured manufacturing characteristics. For example, the information gathered can include the thermal barrier coating thickness, blade airflow and wall thickness of the blades within an aviation engine. Based on the obtained information, the system 100 can evaluate the knowledgebase (or multiple knowledgebases) and generate one or more models of the subset of components employed to facilitate automatically generating the standard deviation and the period of time for trading that maximizes durability performance. The predictive analytics of the system 100 can determine that, if information of a subset of components is similar to one or more other subsets of components, the models of the similar subsets of components can be utilized to facilitate automatically generating the standard deviation and the period of time for trading that maximizes durability performance.

The computer processing systems, computer-implemented methods, apparatus and/or computer program products described herein can employ hardware and/or software to generate models that are highly technical in nature, that are not abstract and that cannot be performed as a set of mental acts by a human. For example, the one or more embodiments can perform the lengthy and complex interpretation and analysis on a copious amount of available information to determine a standard deviation and period of time for trading that maximizes durability performance. In another example, the one or more embodiments can perform predictive analytics on a large amount of data to facilitate generating one or more models of the subset of components to automatically generate the standard deviation and the period of time for trading that maximizes durability performance with a high level of accuracy, even in the absence of detailed knowledge about the subset of components. Accuracy can be evaluated by comparing a training set with a test set. After training a model employing a training set, accuracy can be calculated using a test set by computing percentage of output generated by the model running on the training set elements that matches a predicted target.

In various embodiments, the input component 108 can receive measured manufacturing characteristics. The measured manufacturing characteristics can include, but is not limited to, thermal barrier coating thickness, blade airflow (e.g., airflow) and wall thickness. These manufacturing characteristics can affect the thermal performance of the blades or the thermal life expectancy of the blades. Therefore, the thermal performance of the blades can be measured relative to the mean life or lifespan of the blades. The mean life of the blades can be quantified in terms of number of cycles (e.g., takeoff and landing) that a blade has before it reaches end use. For example, the blades with a robust thermal performance has on average a number of cycles more than the average blades.

The thermal barrier coating can insulate the blades from thermal fatigue thereby extending the mean life of the blades. For example, a blade with a thicker thermal barrier coating has better insulation from thermal fatigue than does a blade with a thinner thermal barrier coating. Additionally, many turbine blades are hollow airfoil that can channel airflow for internal cooling. Internal cooling can be attained by injecting a coolant inside the blades. Airflow measurements can be performed by measuring the mass rate of airflow. Airflow measurements can be performed to verify that the mass rate of airflow is within minimum and maximum limits for total blade airflow. If the minimum amount of coolant is not present, the blades can have a shorter mean life than intended. Similarly, the wall thickness of the blades can also be a determinant of mean life. The wall thickness of a blade can vary between blades during production.

Within a set of conforming blades, some blades can be more robust than others in terms of thermal performance. For example, one blade can be flown a number of cycles while another blade can be flown a greater number of cycles. The blades can be evaluated based on thermal performance and kitted together based on standard deviation. The blades that have a similar thermal performance can be kitted together so that they degrade at the same time. This kitting algorithm can be used to reduce downtime. For example, if the blades degrade at different times, the engine would need to be taken apart to repair one blade, then another, then another and so on. In order to avoid kitting sets of blades that are too similar and cause unforeseen downstream effects, the kitting algorithm can also introduce variation into the sets of kitted blades. For example, a kit can trade a component or blade with another kit that is one standard deviation away about 68% of the time and two standard deviations away about 28% of the time. In other examples, a kit can trade a component or blade with another kit at a different standard deviation and/or different period of time for trading.

Tailoring the performance of the components to have a known distribution of performance can affect the Weibull distribution or probability distribution of the engine life or performance. Instead of the component set or set of blades demanding removal because of an outlier, the proposed concept tailors the Weibull distribution to a known distribution of component performance, and the components will degrade or perform more similarly as a set. The Weibull distributions for the HPT S1Bs are dictated by the weakest performer in the set. For example, if 61 of the 62 HPT S1Bs are performing well but one has poor thermal performance, it will drive the engine off wing earlier than expected. Kitting enables more predictive maintenance of the engine and greater fleet-wide durability performance.

Simulations can be employed using the cumulative damage model (CDM) to approximate the fleet impact of grouping components. A CDM can determine the condition driving distress and the number of exposures to that condition that led to accelerated distress. For example, exposures to dusty conditions resulting in dust collecting on a part in turn can lead that part to become hotter in operation. An analysis can predict the number of remaining exposures the part can withstand before it should be serviced or scheduled for maintenance. Components or blades that employ intelligent kitting should require service or maintenance at about the same time using the CDM simulation.

The calculation component 110 can calculate the standard deviation between the components or blades for the aviation engines. The standard deviation can be based on a statistical distribution of thermal performance of the components or blades. The calculation component 110 can also calculate the thermal performance of the components or the blades. The thermal performance can be evaluated based on measured manufacturing characteristics such as thermal barrier coating thickness, blade airflow and wall thickness. These manufacturing characteristics can be a determinant of mean life of the blades. For example, the thermal barrier coating thickness and the blade airflow can protect the blades from thermal fatigue, and the wall thickness can be a determinant as to whether a blade meets minimum standards. The calculation component 110 can calculate the mean life of the blades based on the thermal barrier coating thickness, blade airflow and wall thickness. The blades can be ranked according to thermal performance level by the calculation component 110. Based on the thermal performance of the blades, the calculation component 110 can calculate the standard deviation between the components or blades compared to the statistical population of all the components or blades.

The selection component 112 can select (e.g., group, kit, organize, etc.) the components for aviation engines based on the thermal performance calculated by the calculation component 110 from the measured manufacturing characteristics. For example, the components or blades can be grouped together based on measurements relevant to their thermal life expectancy (e.g., thermal performance). Kitting the blades can help avoid having one weak blade that fails before the others. Aviation engines can be driven off wing and placed in downtime repair by a minimally thermal protected blade. The remaining blades that still have life are then forced to be driven off wing, removed or scrapped, and extra cycles are wasted. For example, one blade can have a number of cycles while another blade can have a greater number of cycles. Randomly selecting blades can ensure that the blades do not fail at similar times, however, the durability performance can still be driven by a single blade.

Intelligent kitting with variance can save time spent on maintenance so that the engine does not have to be taken apart because one weak blade needs to be repaired. Intelligent kitting can result in greater overall fleet durability performance, reduce shop visits and reduce premature scrapping of components. Blades that are kitted together according to thermal performance levels have similar number of cycles. Maintenance can be scheduled for the blades together. A minimum amount of variance can be introduced so the blades do not all fail at exactly the same time. The kitting algorithm can use a normal distribution approach to introduce an adjustable amount of variance into the sets of blades for stability in order to avoid creating sets that are too similar.

The selection component 112 can also select a subset of components (e.g., kit) based on the calculated standard deviation. The subset of components can be based at least in part on thermal barrier coating thickness, blade airflow and wall thickness. The subset of components has to be within minimum and maximum limits for total blade airflow. The blade airflow can be measured based on the mass rate of airflow. The blade airflow data can be received by the input component 108. For example, the selection component 112 can select subsets of components that are one standard deviation away, two standard deviations away, etc. Furthermore, the selection component 112 can make trades among the subsets of components (e.g., kits) as a function of similarity based on a normal statistical distribution to introduce variation into the subset of components (e.g., kit). The selection component 112 can trade components or blades between kits having one standard deviation. For example, the selection component 112 can trade components or blades of a kit with another kit that is one standard deviation away at about 68% of the time. The selection component 112 can trade components or blades between kits having two standard deviations away. For example, the selection component 112 can trade components or blades of a kit with another kit that is two standard deviations away at about 28% of the time. It is appreciated that the selection component 112 can trade components or blades between the kits at a different a standard deviation away and/or a different period of time for trading.

In one implementation, the selection component 112 can search the entries in the one or more servers' 116 data store. In another implementation, the selection component 110 can send information relating to the selection of the subset of components to the one or more servers 116. The one or more servers 116 can record information in the server data stores.

In one or more embodiments, the system 100 can utilize a cloud-based analysis or local-based analysis of the received data to select the subset of components. For example, the selection component 112 can select the subset of component based on the analysis of the selection results of the subsets of components recorded in the server data stores. The selection result can include information relating to the measured manufacturing characteristics of the components, standard deviation of the components and the subsets of components, the period of time for trading, etc.

The analysis component 114 can analyze the subset of components at respective standard deviation to determine a standard deviation and period of time for trading that maximizes durability performance. In order to avoid unforeseen downstream effects of creating sets of blades that are too similar, the analysis component 114 can employ the kitting algorithm which uses a normal distribution approach to introduce an adjustable amount of variance into the sets of components or blades. To introduce a known amount of variation into the sets of kitted blades, the analysis component 114 can analyze and determine the number of times a kit can make trades with another kit that is one standard deviation away. The analysis component 114 can also analyze and determine the number of times a kit can make trades with another kit that is two standard deviations away. For example, the analysis component 114 can determine that a kit can trade components or blades with another kit at one standard deviation away at about 68% of the time. In another example, the analysis component 114 can determine that a kit can trade components or blades with another kit at two standard deviations away at about 28% of the time. It is appreciated that the analysis component 114 can analyze the number of times a kit can make trades with another kit at a different standard deviation away and/or period of time for trading that maximizes durability performance.

Figure 2:
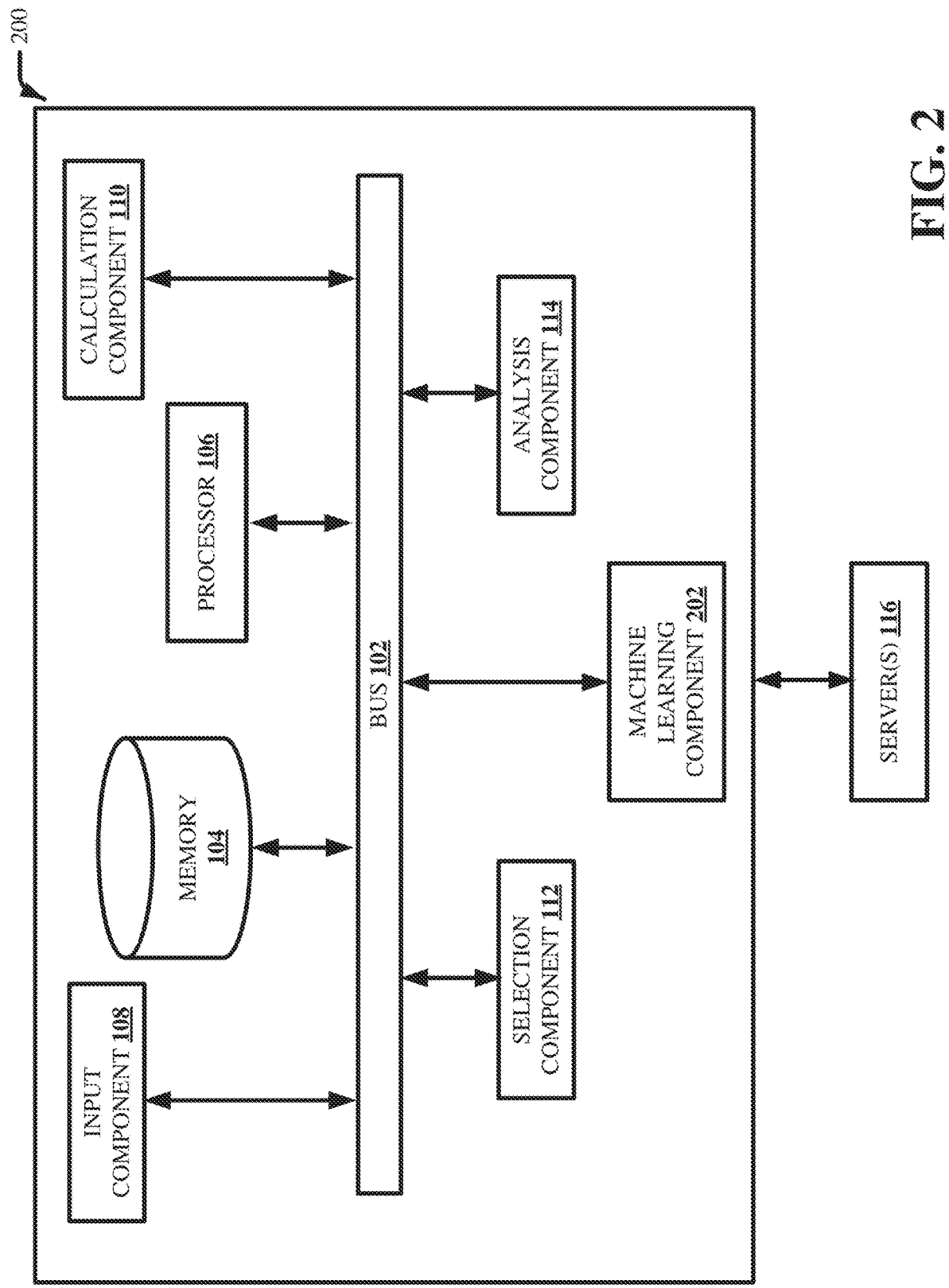
FIG. 2 illustrates a block diagram of an example, non-limiting system facilitating selecting components for aviation engines including a machine learning component in accordance with one or more embodiments described herein.

FIG. 2 illustrates a block diagram of an example, non-limiting system 200 facilitating selecting components for aviation engines including a machine learning component 202 in accordance with one or more embodiments described herein. Repetitive description of like elements employed in other embodiments described herein is omitted for sake of brevity. The machine learning component 202 can identify patterns and make predictions from the data received by the input component 108, the calculation made by the calculation component 110, the selection made by the selection component 112 and the variance analyzed by the analysis component 114. For example, the machine learning component 202 can observe the measured manufacturing characteristics (e.g., thermal barrier coating thickness, blade airflow, wall thickness, etc.) received by the input component 108. In another example, the machine learning component 202 can observe the standard deviation calculated by the calculation component 110 and kitted together by the selection component 112. In yet another example, the machine learning component 202 can observe the amount of variance introduced by the analysis component 114 by employing the kitting algorithm. In one implementation, the machine learning component 202 can search the entries in the one or more servers' 116 data stores. In one or more embodiments, the machine learning component 202 can utilize a cloud-based analysis or a local-based analysis of the data to enable generating of one or more models of the subset of components.

More specifically, the machine learning component 202 can employ artificial intelligence to learn the standard deviation between the components enabling building of one or more models of the subset of components. For example, the observed information can be used to build models to make predictions. The models can be used to automatically generate predictions of the standard deviation and the period of time for trading that maximizes durability performance and minimize downtime. Additionally, the machine learning component 202 can perform a utility-based analysis that factors benefits associated with selecting one subset of components over another subset of components. For example, selecting one subset of components over another can result in a different standard deviation that can affect the durability performance.

The embodiments of devices described herein can employ artificial intelligence (AI) to facilitate automating one or more features described herein. The components can employ various AI-based schemes for carrying out various embodiments/examples disclosed herein. In order to provide for or aid in the numerous determinations (e.g., determine, ascertain, infer, calculate, predict, prognose, estimate, derive, forecast, detect) described herein, components described herein can examine the entirety or a subset of the data to which it is granted access and can provide for reasoning about or determine states of the system, environment, etc., from a set of observations as captured via events and/or data. Determinations can be employed to identify a specific context or action, and/or can generate a probability distribution over states, for example. The determinations can be probabilistic-that is, the computation of a probability distribution over states of interest based on a consideration of data and events. Determinations can also refer to techniques employed for composing higher-level events from a set of events and/or data.

Such determinations can result in the construction of new events or actions from a set of observed events and/or stored event data, whether or not the events are correlated in close temporal proximity, and whether the events and data come from one or several event and data sources. Components disclosed herein can employ various classification (explicitly trained (e.g., via training data) as well as implicitly trained (e.g., via observing behavior, preferences, historical information, receiving extrinsic information, etc.)) schemes and/or systems (e.g., support vector machines, neural networks, expert systems, Bayesian belief networks, fuzzy logic, data fusion engines, etc.) in connection with performing automatic and/or determined action in connection with the claimed subject matter. Thus, classification schemes and/or systems can be used to automatically learn and perform a number of functions, actions, and/or determination.

A classifier can map an input attribute vector, $z=(z1, z2, z3, z4, zn)$, to a confidence that the input belongs to a class, as by $f(z)=$confidence(class). Such classification can employ a probabilistic and/or statistical-based analysis (e.g., factoring into the analysis utilities and costs) to determinate an action to be automatically performed. A support vector machine (SVM) is an example of a classifier that can be employed. The SVM operates by finding a hyper-surface in the space of possible inputs, where the hyper-surface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

Figure 3:
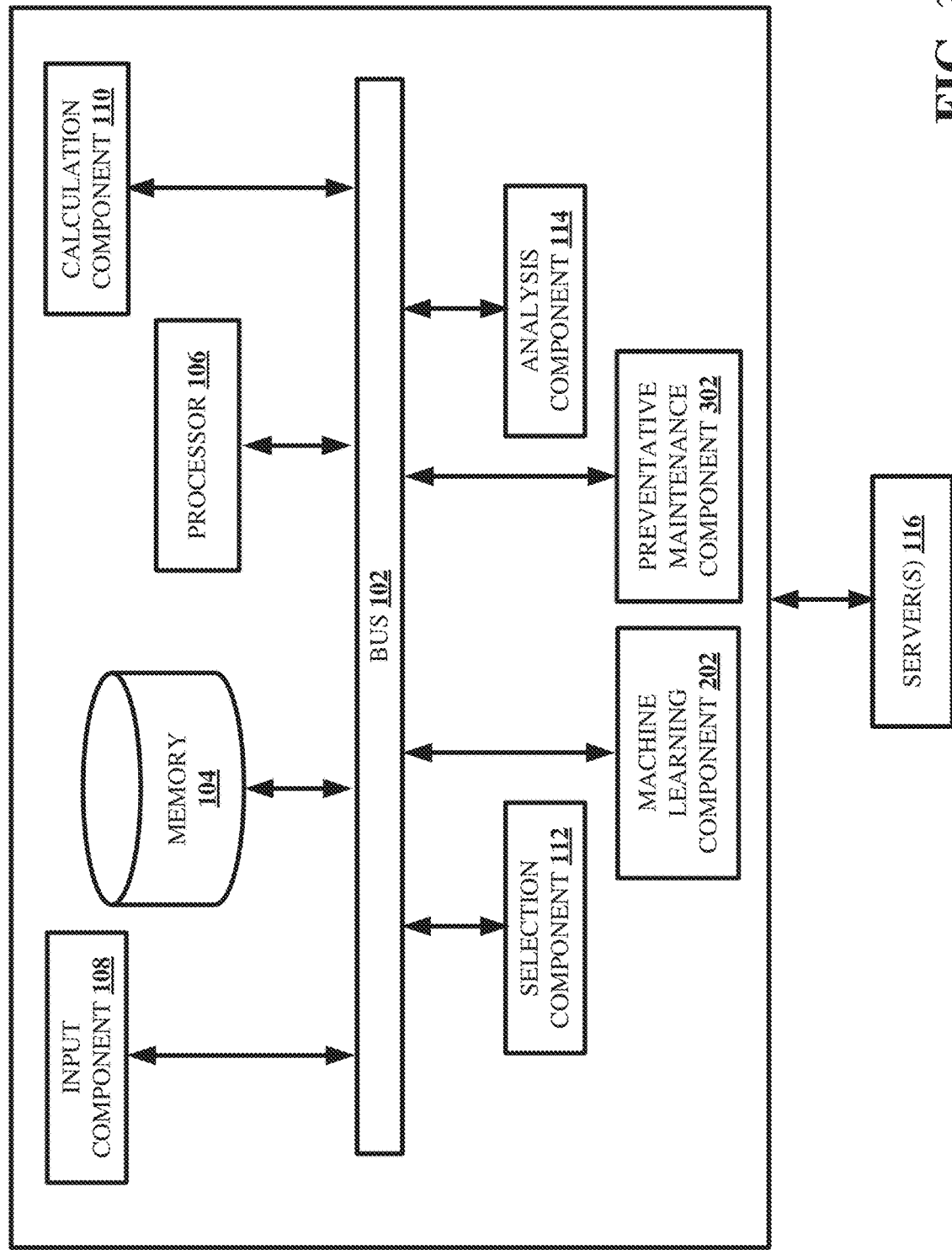
FIG. 3 illustrates a block diagram of an example, non-limiting system facilitating selecting components for aviation engines including a preventative maintenance component in accordance with one or more embodiments described herein.

FIG. 3 illustrates a block diagram of an example, non-limiting system 300 facilitating selecting components for aviation engines including a preventative maintenance component 302 in accordance with one or more embodiments described herein. Repetitive description of like elements employed in other embodiments described herein is omitted for sake of brevity. The preventative maintenance component 302 can predict maintenance schedule based on the standard deviation calculated by the calculation component 110. The blades are kitted together according to thermal performance (e.g., thermal life expectancy) and the standard deviation between the blades and the statistical population of blades. The blades with similar standard deviation will have a similar mean life. Accordingly, the preventative maintenance component 302 can predict the maintenance schedule for the set of components or blades that maximizes durability performance. For example, the blades can be scheduled for maintenance at the same time because the blades are kitted with other blades with a similar mean life.

Figure 4:
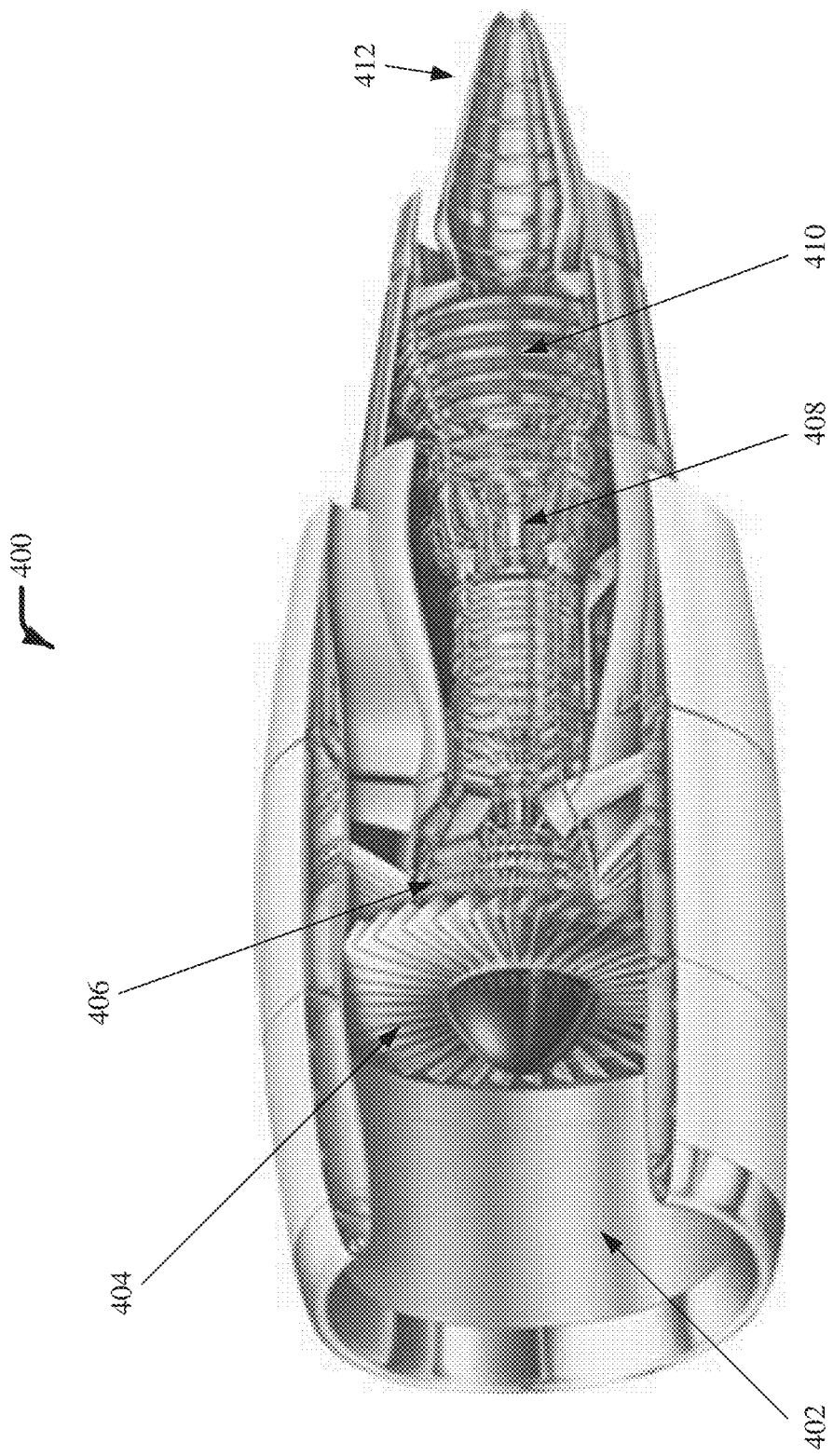
FIG. 4 illustrates an example, non-limiting cross-section of an aviation engine in accordance with one or more embodiments described herein.

FIG. 4 illustrates an example, non-limiting cross-section of an aviation engine 400 in accordance with one or more embodiments described herein. Repetitive description of like elements employed in other embodiments described herein is omitted for sake of brevity. The engine 400 includes an inlet 402, a fan 404, a compressor 406, a combustor 408, a turbine 410 and a nozzle 412. The inlet 402 can continuously draw air into the engine 400 through the inlet 402 and ensure smooth airflow into the engine 400.

The fan 404 and the compressor 406 are made up of rotating blades and stationary vanes. The pressure and temperature of the air increases as it moves through the compressor 406. The combustor 408 can continuously add fuel to compressed air and burn it. The turbine 410 is a series of bladed discs that can extract energy from the hot gases leaving the combustor. Some of this energy can also be used to drive the compressor 406. Cooling air or coolant from the compressor 406 can be used to cool the turbine blades of the turbine 410. The exhaust gases from the turbine 410 pass through the nozzle 412 to produce a high velocity jet.

The HPT S1Bs of the turbine 410 are in the hot section of the engine 400 where thermal fatigue can degrade the blades. The temperature of the turbine 410 can reach over 2,000° F. (1,093° C.). When the blades or any of the components in the engine 400 breaks down, the engine needs to be taken apart for maintenance (e.g., MRO). To reduce the number of times an engine such as the engine 400 comes off wing for maintenance, the embodiments herein can employ the kitting algorithm for intelligent kitting that groups (e.g., via the selection component 112) components together based on their thermal life expectancy (e.g., calculated via the calculation component 110). The embodiments herein can also employ the kitting algorithm to introduce a known amount of variation (e.g., analyzed via the analysis component 114) into the sets of kitted components or blades while still using the most similar components or blades possible. A known amount of variation can be introduced to avoid unforeseen downstream effects of creating sets of blades that are too similar. The kitting algorithm can use a normal distribution approach to introduce an adjustable amount of variance into the sets of blades. Moreover, the kitting algorithm can make trades (e.g., selected via the selection component 112) between similar kits based on a normal statistical distribution.

Figure 5:
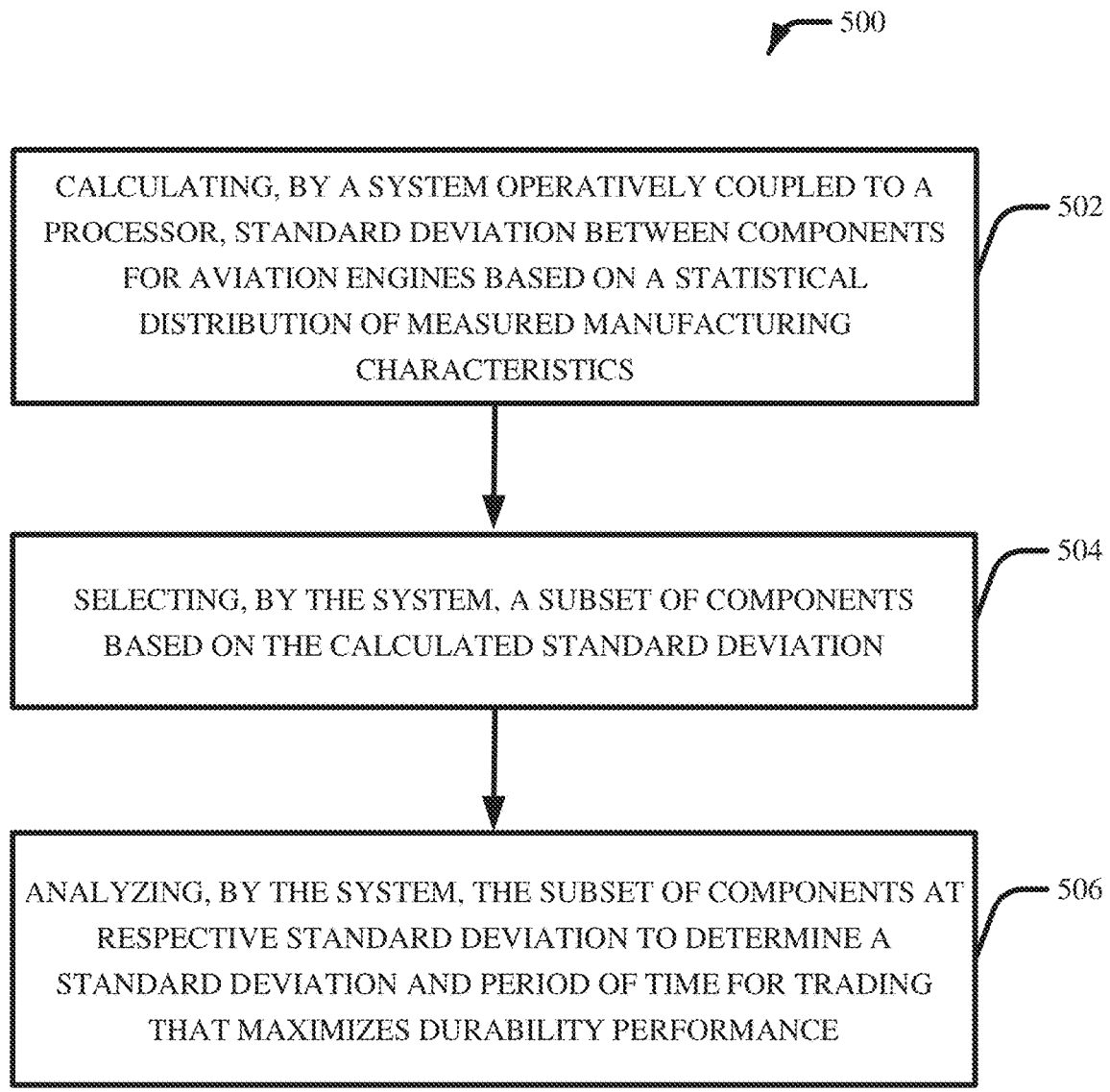
FIG. 5 illustrates a flow diagram of an example, non-limiting computer-implemented method for facilitating selecting components for aviation engines in accordance with one or more embodiments described herein.

FIG. 5 illustrates a flow diagram of an example, non-limiting computer-implemented method 500 for facilitating selecting components for aviation engines in accordance with one or more embodiments described herein. Repetitive description of like elements employed in other embodiments described herein is omitted for sake of brevity. At 502, the computer-implemented method 500 can comprise calculating (e.g., via the calculation component 110), by a system operatively coupled to a processor, standard deviation between components for aviation engines based on a statistical distribution of measured manufacturing characteristics. The measured manufacturing characteristics can include, but is not limited to, the thermal barrier coating thickness, blade airflow and wall thickness. These manufacturing characteristics can be received by the input component 108.

At 504, the computer-implemented method 500 can comprise selecting (e.g., via the selection component 112), by the system, a subset of components based on the calculated standard deviation. The blades can be kitted together based on the calculated standard deviation to avoid having engines that are driven off wing by a single blade and maximize durability performance. The selection component 112 can select the subset of components based at least in part by the barrier coating thickness, blade airflow and wall thickness. A minimum amount of variance can be introduced into the subset of components for stability. For example, the selection component 112 can trade among the subsets of components as a function of similarity based on a normal statistical distribution to introduce variation into the subset of components.

At 506, the computer-implemented method 500 can comprise analyzing (e.g., via the analysis component 114), by the system, the subset of components at respective standard deviation to determine a standard deviation and period of time for trading that maximizes durability performance. The analysis component 114 can use the kitting algorithm to introduce an adjustable amount of variance into the subset of components (e.g., set of blades, kit of blades, etc.). Variations can be introduced into the subset of components (e.g., kit) to avoid unforeseen downstream effects of creating sets of blades that are too similar. The analysis component 114 can introduce an adjustable amount of variance into the sets of blades by analyzing the amount of time a kit can trade component with another kit that is one standard deviation away.

Furthermore, the analysis component 114 can analyze the amount of time a kit can trade component with another kit that is two standard deviations away. For example, the analysis component 114 can analyze that a kit can trade a component or blade with another kit that is one deviation away at about 68% of the time. In another example, the analysis component can analyze that a kit can trade a component or blade with another kit that is two standard deviations away at about 28% of the time. It is appreciated that the analysis component can also analyze a period of time that a kit can trade a component or blade with another kit at a different standard deviation.

Figure 6:
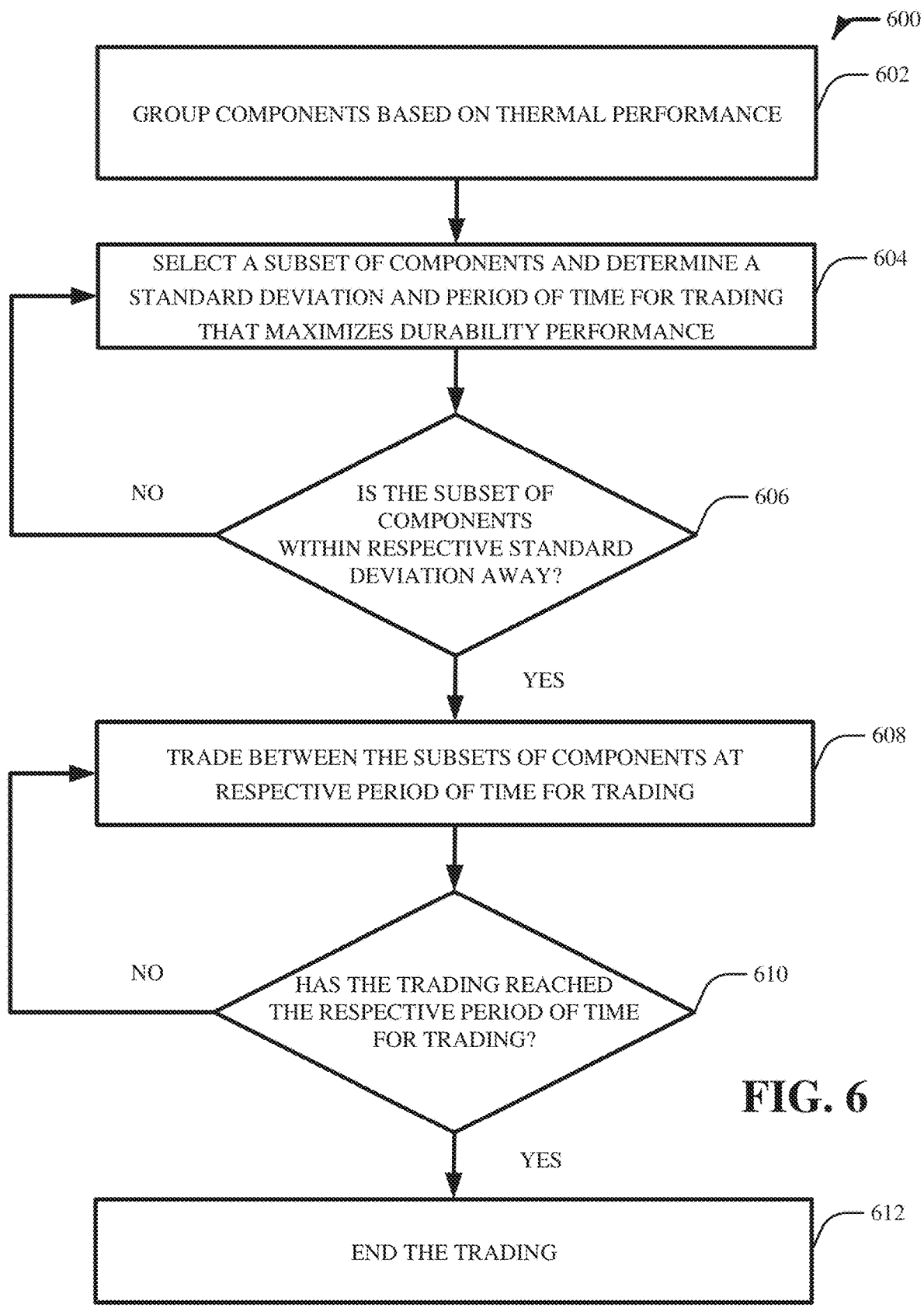
FIG. 6 illustrates a flow diagram of an example, non-limiting computer-implemented method for facilitating trading among the subsets of components in accordance with one or more embodiments described herein.

FIG. 6 illustrates a flow diagram of an example, non-limiting computer-implemented method 600 for facilitating trading among the subsets of components in accordance with one or more embodiments described herein. Repetitive description of like elements employed in other embodiments described herein is omitted for sake of brevity. At 602, the computer-implemented method 600 can comprise grouping (e.g., selecting or kitting via the selection component 112) components for aviation engines based on the thermal performance calculated by the calculation component 110 from the measured manufacturing characteristics. For example, the components can be grouped together based on measured manufacturing characteristics that can affect the thermal performance or thermal life expectancy of the components. Kitting the components can help avoid having one weak component failing much sooner than a majority of the components.

At 604, the computer-implemented method 600 can comprise selecting (e.g., via the selection component 112) a subset of components (e.g., kits) based on the calculated (e.g., via the calculation component 110) standard deviation. The calculation component 110 can calculate the standard deviation between the subsets of components (e.g., kits). The calculation component 110 can calculate the standard deviation based on a statistical distribution of measured manufacturing characteristics of the components or blades. The measured manufacturing characteristics can include, but is not limited to, the thermal barrier coating thickness, the blade airflow and wall thickness.

At 604, the computer-implemented method 600 can also comprise determining (e.g., via the analysis component 114) a standard deviation and period of time for trading that maximizes durability performance. Trades can be made between similar subsets of components (e.g., kits) based on a normal statistical distribution to introduce variation into the subset of components (e.g., kit) to avoid unforeseen downstream effects of creating sets of blades too similar. For example, the analysis component 114 can determine that trades can be made between kits that are one standard deviation away at about 68% of the time. In another example, the analysis component 114 can determine that trades can be made between kits that are two standard deviations away at about 28% of the time. It is appreciated that the analysis component 114 can also analyze the period of time trades can be made at a different standard deviation.

At 606, the computer-implemented method 600 can comprise determining (e.g., via the selection component 112) whether the subset of components is within respective standard deviation away. More specifically, the selection component 112 can determine whether the subset of components is within a standard deviation away analyzed by the analysis component 114 that a trade can be made at a respective period of time for trading. If the subset of components is not within a respective standard deviation away that a trade can be made, the process repeats at 604 (e.g., select another subset of components or trade with another kit as multiple kits are trading/optimizing at the same time). If the subset of components is within a respective standard deviation away that a trade can be made, the process continues to 608.

At 608, the computer-implemented method 600 can comprise trading (e.g., via the selection component 112) between the kits at respective period of time for trading. For example, the selection component 112 can trade among the subsets of components (e.g., kits) having one standard deviation away at about 68% of the time. In yet another example, the selection component 112 can also trade among the subsets of components having two standard deviations away at about 28% of the time. It is appreciated that the selection component 112 can trade among the subsets of components at a different standard deviation and/or at a different period of time for trading.

At 610, the computer-implemented method 600 can comprise determining (e.g., via the selection component 112) whether the trading reached a respective period of time for trading. If the trading has not reached a respective period of time for trading analyzed by the analysis component 114 that a trade can be made, the process repeats at 608. If the trading has reached a respective period of time for trading analyzed by the analysis component 114 that a trade can be made, the process continues to 612. For example, if the subsets of components are one standard deviation away, the trading can continue to be made up to about 68% of the time. It is appreciated that the trading can be made at a different standard deviation and/or a different period of time for trading.

At 612, the computer-implemented method 600 can comprise ending (e.g., via the selection component 112) the trading. The selection component 112 can determine that the trading has reached a respective period of time for trading and stop trading. For example, if two subsets of components are one standard deviation away and the period of time for trading is 68% of the time, the selection component 112 can determine that the trading is complete and end the trading process when the percentage of trading reaches 68%. In another example, if two subsets of components are two standard deviations away and the period of time for trading is 28% of the time, the selection component 112 can determine that the trading is complete and end the trading process when the percentage of trading reaches 28%. It is appreciated that multiple subsets of components (e.g., multiple kits) can trade at the same time. It is appreciated that the trading can continue for other subsets of components with the ending of trading between two subsets of components.

Figure 7:
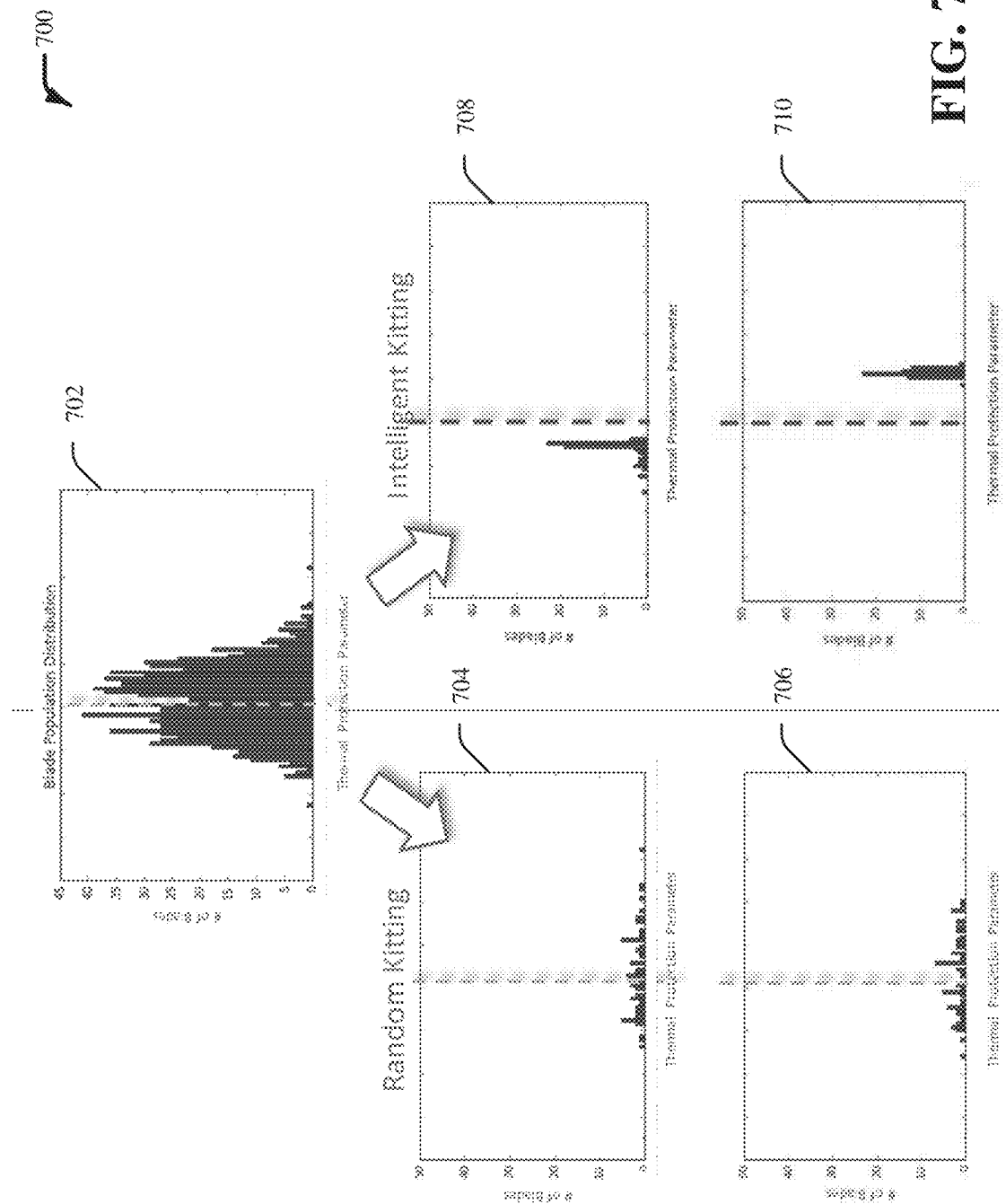
FIG. 7 illustrates example, non-limiting graphs depicting the difference between random kitting and intelligent kitting in accordance with one or more embodiments described herein.

FIG. 7 illustrates example, non-limiting graphs 700 depicting the difference between random kitting and intelligent kitting in accordance with one or more embodiments described herein. Repetitive description of like elements employed in other embodiments described herein is omitted for sake of brevity. The graph 702 illustrates the blade population distribution or statistical population of all the blades based on thermal protection parameter or thermal performance. The graph 704 is an illustration of how the thermal performance of the blades compares to one another using random kitting. Likewise, the graph 706 is another set of randomly kitted blades that illustrates how well the blades perform thermally relative to the other blades in the kit. With random kitting, the blades are unlikely to fail at the same time. However, the durability performance can still be driven by a single blade (e.g., the first blade to fail) that have a low thermal protection parameter relative to the majority of the blades. Therefore, with random kitting, the engines can still require more frequent repairs as the blades fail.

The graphs 708 and 710 illustrate blades that have been kitted by employing intelligent kitting. The intelligently kitted blades in the graphs 708 and 710 have a more uniform wear rate at a closer point in time. With intelligent kitting, the blades can be kitted together based on the standard deviation of thermal performance between the blades. As illustrated in the graph 708, the blades have a similar (e.g., close in range) thermal performance parameter (e.g., thermal performance level). Variations can be introduced to prevent unforeseen downstream effects of having blades that are too similar. The variations are illustrated as those blades that have a thermal protection parameter above and below the majority of the blades. The variance of the thermal protection parameter between the blades is a minimum amount. As illustrated, the range of the thermal protection parameter between the blades in the graph 708 is minimum compared to the blades in the graphs 704 and 706 with random kitting.

The graph 710 is another example of intelligent kitting. The graph 710 is another set of blades that have been intelligently kitted with a higher thermal protection parameter than the set of blades in the graph 708. Overall, the blades in the graph 710 have a more robust thermal performance (e.g., higher thermal protection parameter) than the blades in the graph 708. Both the blades in the graphs 708 and 710 can also benefit from other aspects of kitting as well. For example, the blades in the graph 708 with a lower thermal protection parameter can benefit from increased efficiency, and both the blades in the graphs 708 and 710 can benefit from increased modeling accuracy due to decreased system variation (e.g., decreased variation within the sets of blades).

Like the blades in the graph 708, the blades in the graph 710 also have a similar (e.g., close in range) thermal protection parameter with one another. Likewise, variations can be introduced so that the blades in the graph 710 do not have the exact thermal protection parameter. Furthermore, the variance of the thermal protection parameter between the blades in the graph 710 is minimum compared to the graphs 704 and 706 with random kitting.

Figure 8:
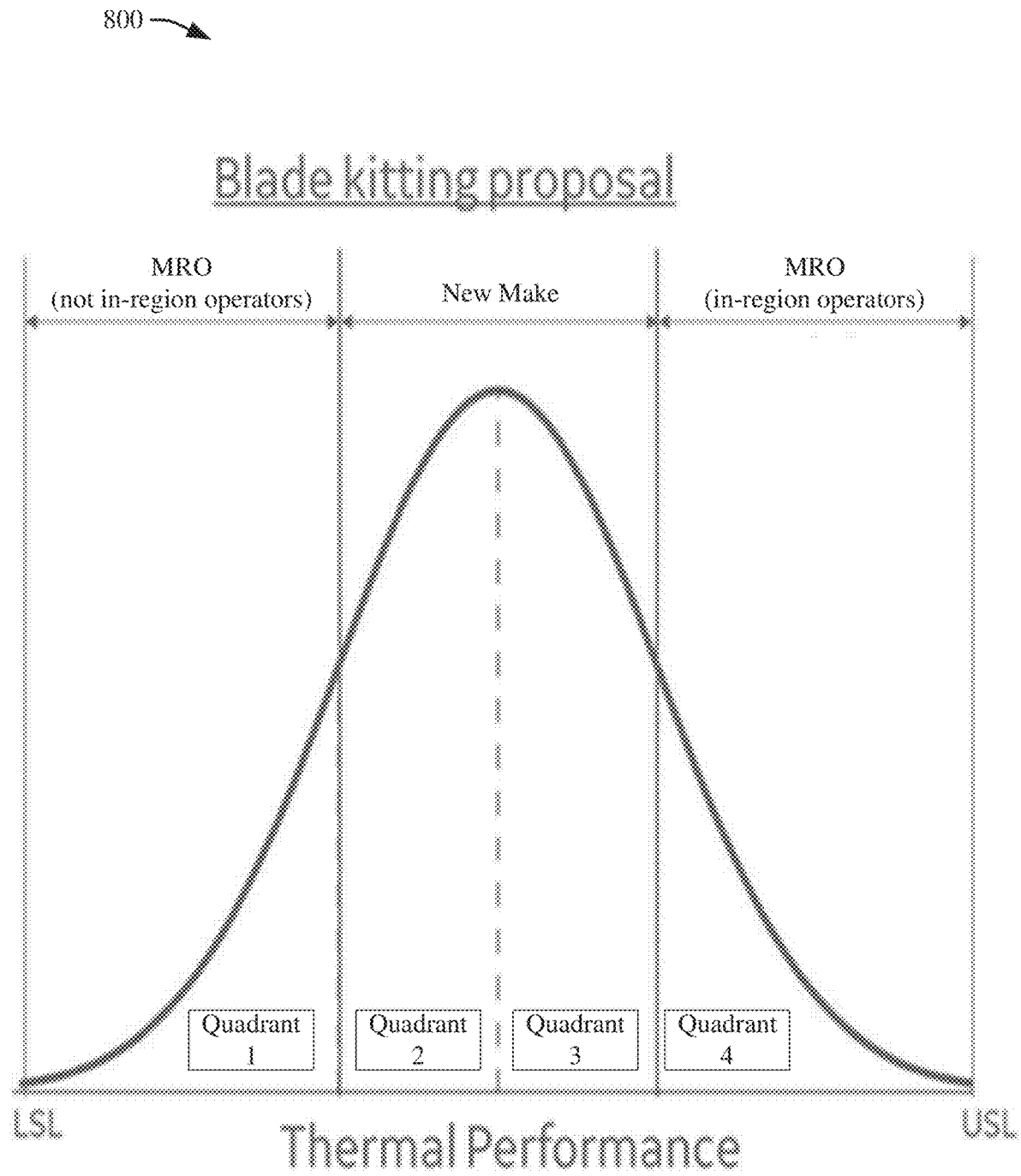
FIG. 8 illustrates an example, non-limiting graph depicting four quartiles of thermal performance in accordance with one or more embodiments described herein.

FIG. 8 illustrates an example, non-limiting graph 800 depicting four quartiles of thermal performance in accordance with one or more embodiments described herein. Repetitive description of like elements employed in other embodiments described herein is omitted for sake of brevity. The graph 800 is a non-limiting example of a blade kitting proposal divided into four quadrants: quadrant 1, quadrant 2, quadrant 3 and quadrant 4. The quadrants are divided based on thermal performance with quadrant 1 starting at the lower specification limit (LSL) and quadrant 4 ending at the upper specification limit (USL). It is appreciated that the thermal performance can be divided into any number of sections other than the four quadrants. It is also appreciated that the blade kitting proposal can be modified to tailor to the needs of a business.

In the middle are quadrants 2 and 3. The blades falling within quadrants 2 and 3 can be kitted as new make that would automatically get a longer durability performance because the blades with a lower thermal performance (e.g., the blades in quadrant 1) are not included. More specifically, the lower thermal performance blades that account for about 37.5% of the blades in the example, non-limiting graph 800 are trimmed off. The trimming of the lower thermal performance blades results in an automatic increase in mean life for the new make engines. The blades in quadrants 2 and 3 are not driven off wing by the blades in quadrant 1 that have a lower thermal performance, e.g., that are less thermally protected.

The lower thermal performance blades can benefit from other aspects of kitting such as increased efficiency and increased modeling accuracy due to decreased system variation. The blades with a lower thermal performance in quadrant 1 can be kitted together and used for maintenance, repair and overhaul (MRO) and not as an in-region operator. In-region operators are aircrafts that operate in parts of the globe where elevated ambient temperatures coupled with pollution and particulate matter in the air are challenging to the thermal and mechanical durability of the hardware in the hot section of the engines. Quadrant 1 is not recommended as an in-region operator because the operators in quadrant 1 are already flying with lower thermal performance blades. The lower thermal performance blades in quadrant 1 will not affect the Weibull distribution for those fleets that are already flying with lower thermal performance blades.

Quadrant 4 contains the most robust durability performance blades of the four quadrants. The blades in quadrant 4 have on average a number of cycles more than the average blades. The higher thermal performance blades of Quadrant 4 can also benefit from another aspect of kitting such as increased modeling accuracy due to decreased system variation. The blades in quadrant 4 can be used for MRO as well. However, the blades in quadrant 4 are recommended for in-region operators. The in-region operators of quadrant 4 need the most robust durability performance blades. The most robust durability performance blades in quadrant 4 can be sent to customers who are environmentally severe operators that would need the durability performance. The reason is that extreme atmospheric conditions can cause the blades to heat up and degrade at a faster rate. For example, air pollution can lead dust to collect on the blades causing those blades to become hotter in operation and such temperature rise can reduce the life of those blades at a faster rate.

Furthermore, within quadrants 1, 2, 3 and 4, the blades can further be kitted using the kitting algorithm. Kitting can be a method for improving overall fleet quality as well as individual engine benefits. The blades can be evaluated based on thermal performance and kitted together with variations in standard deviation that optimize the durability performance. For example, the calculation component 110 can calculate the standard deviation of the thermal performance between the components based on a statistical distribution of the measured manufacturing characteristics (e.g., thermal barrier coating thickness, blade airflow, wall thickness, etc.). The selection component 112 can group (e.g., select, kit, organize, etc.) components based on the thermal performance. The selection component 112 can also select the subset of components (e.g., kit) based on the standard deviation calculated by the calculation component 110. The subset of components can also be selected with variance based on the standard deviation of the thermal performance for stability. The variance can be analyzed by the analysis component 114. The analysis component 114 can analyze that a subset of components can have a certain standard deviation at a certain period of time for trading that maximizes durability performance.

Figure 9:
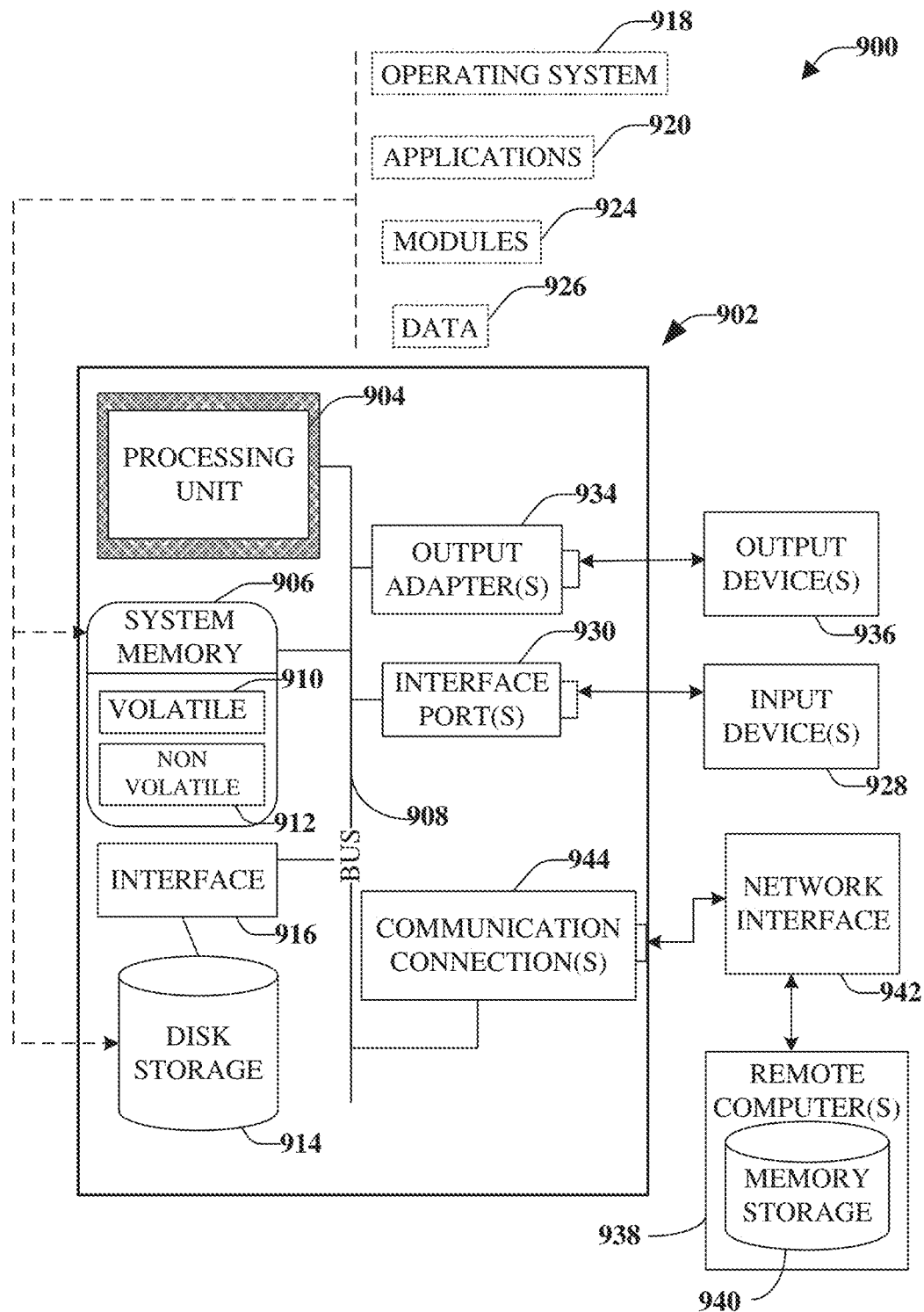
FIG. 9 illustrates a block diagram of an example, non-limiting operating environment in which one or more embodiments described herein can be facilitated.

To provide a context for the various aspects of the disclosed subject matter, FIG. 9 as well as the following discussion are intended to provide a general description of a suitable environment in which the various aspects of the disclosed subject matter can be implemented. FIG. 9 illustrates a block diagram of an example, non-limiting operating environment in which one or more embodiments described herein can be facilitated. Repetitive description of like elements employed in other embodiments described herein is omitted for sake of brevity.

With reference to FIG. 9, a suitable environment 900 for implementing various aspects of the claimed subject matter includes a computer 902. The computer 902 includes a processing unit 904, a system memory 906, a codec 905, and a system bus 908. The system bus 908 couples system components including, but not limited to, the system memory 906 to the processing unit 904. The processing unit 904 can be any of various available processors. Dual microprocessors and other multiprocessor architectures also can be employed as the processing unit 904.

The system bus 908 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 906 includes volatile memory 911 and non-volatile memory 912. The basic input/output system (BIOS), containing the basic routines to transfer information between elements within the computer 902, such as during start-up, is stored in non-volatile memory 912. By way of illustration, and not limitation, non-volatile memory 912 can include read only memory (ROM), programmable ROM (PROM), electrically programmable ROM (EPROM), electrically erasable programmable ROM (EEPROM), or flash memory. Volatile memory 911 includes random access memory (RAM), which acts as external cache memory. According to present aspects, the volatile memory may store the write operation retry logic (not shown in FIG. 9) and the like. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM).

Computer 902 may also include removable/non-removable, volatile/non-volatile computer storage media. FIG. 9 illustrates, for example, a disk storage 914. Disk storage 914 includes, but is not limited to, devices like a magnetic disk drive, solid state disk (SSD) floppy disk drive, tape drive, Zip drive, LS-110 drive, flash memory card, or memory stick. In addition, disk storage 914 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 914 to the system bus 908, a removable or non-removable interface is typically used, such as interface 916.

It is to be appreciated that FIG. 9 describes software, software in execution, hardware, and/or software in combination with hardware that acts as an intermediary between users and the basic computer resources described in the suitable operating environment 900. Such software includes an operating system 918. Operating system 918, which can be stored on disk storage 914, acts to control and allocate resources of the computer system 902. Applications 920 take advantage of the management of resources by operating system 918 through program modules 924, and program data 926, such as the boot/shutdown transaction table and the like, stored either in system memory 906 or on disk storage 914. It is to be appreciated that the claimed subject matter can be implemented with various operating systems or combinations of operating systems. For example, applications 920 and program data 926 can include software implementing aspects of this disclosure.

A user enters commands or information into the computer 902 through input device(s) 928, non-limiting examples of which can include a pointing device such as a mouse, trackball, stylus, touch pad, keyboard, microphone, joystick, game pad, satellite dish, scanner, TV tuner card, digital camera, digital video camera, electronic nose, web camera, and any other device that allows the user to interact with computer 902. These and other input devices connect to the processing unit 904 through the system bus 908 via interface port(s) 930. Interface port(s) 930 include, for example, a serial port, a parallel port, a game port, and a universal serial bus (USB). Output device(s) 936 use some of the same type of ports as input device(s) 928. Thus, for example, a USB port may be used to provide input to computer 902, and to output information from computer 902 to an output device 936. Output adapter 934 is provided to illustrate that there are some output devices 936 like monitors, speakers, and printers, among other output devices 936, which require special adapters. The output adapters 934 include, by way of illustration and not limitation, video and sound cards that provide a means of connection between the output device 936 and the system bus 908. It should be noted that other devices and/or systems of devices provide both input and output capabilities such as remote computer(s) 938.

Computer 902 can operate in a networked environment using logical connections to one or more remote computers, such as remote computer(s) 938. The remote computer(s) 938 can be a personal computer, a server, a router, a network PC, a workstation, a microprocessor based appliance, a peer device, a smart phone, a tablet, or other network node, and typically includes many of the elements described relative to computer 902. For purposes of brevity, only a memory storage device 940 is illustrated with remote computer(s) 938. Remote computer(s) 938 is logically connected to computer 902 through a network interface 942 and then connected via communication connection(s) 944. Network interface 942 encompasses wire and/or wireless communication networks such as local-area networks (LAN), wide-area networks (WAN), and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 944 refers to the hardware/software employed to connect the network interface 942 to the bus 908. While communication connection 944 is shown for illustrative clarity inside computer 902, it can also be external to computer 902. The hardware/software necessary for connection to the network interface 942 includes, for exemplary purposes only, internal and external technologies such as, modems including regular telephone grade modems, cable modems and DSL modems, ISDN adapters, wired and wireless Ethernet cards, hubs, and routers.

Figure 10:
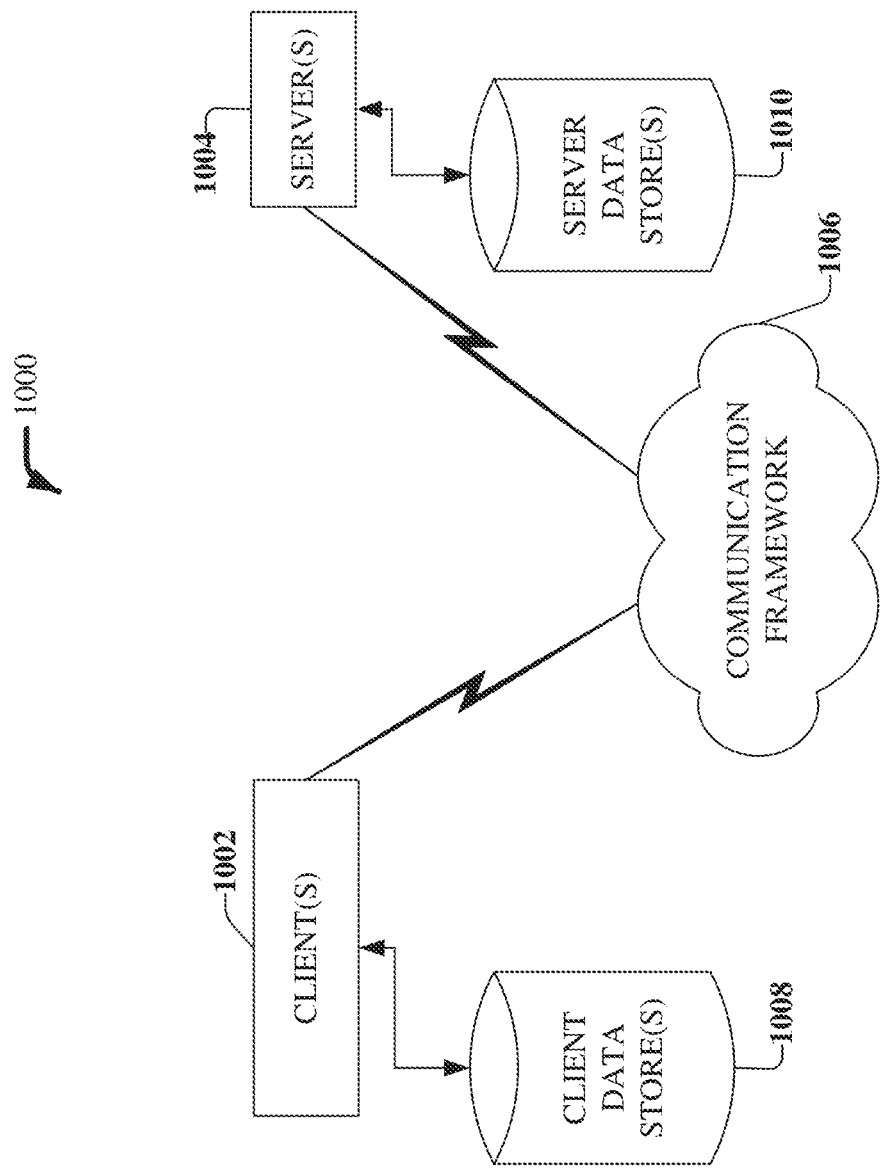
FIG. 10 illustrates an example block diagram of a computer operable to execute various implementations described herein.

Referring now to FIG. 10, there is illustrated a schematic block diagram of a computing environment 1000 in accordance with this specification. The system 1000 includes one or more client(s) 1002, (e.g., computers, smart phones, tablets, cameras, PDA's). The client(s) 1002 can be hardware and/or software (e.g., threads, processes, computing devices). The client(s) 1002 can house cookie(s) and/or associated contextual information by employing the specification, for example.

The system 1000 also includes one or more server(s) 1004. The server(s) 1004 can also be hardware or hardware in combination with software (e.g., threads, processes, computing devices). The servers 1004 can house threads to perform transformations of media items by employing aspects of this disclosure, for example. One possible communication between a client 1002 and a server 1004 can be in the form of a data packet adapted to be transmitted between two or more computer processes wherein data packets may include coded analyzed headspaces and/or input. The data packet can include a cookie and/or associated contextual information, for example. The system 1000 includes a communication framework 1006 (e.g., a global communication network such as the Internet) that can be employed to facilitate communications between the client(s) 1002 and the server(s) 1004.

Communications can be facilitated via a wired (including optical fiber) and/or wireless technology. The client(s) 1002 are operatively connected to one or more client data store(s) 1008 that can be employed to store information local to the client(s) 1002 (e.g., cookie(s) and/or associated contextual information). Similarly, the server(s) 1004 are operatively connected to one or more server data store(s) 1011 that can be employed to store information local to the servers 1004.

In one exemplary implementation, a client 1002 can transfer an encoded file, (e.g., encoded media item), to server 1004. Server 1004 can store the file, decode the file, or transmit the file to another client 1002. It is to be appreciated, that a client 1002 can also transfer uncompressed file to a server 1004 and server 1004 can compress the file and/or transform the file in accordance with this disclosure. Likewise, server 1004 can encode information and transmit the information via communication framework 1006 to one or more clients 1002.

The illustrated aspects of the disclosure may also be practiced in distributed computing environments where certain tasks are performed by remote processing devices that are linked through a communications network. In a distributed computing environment, program modules can be located in both local and remote memory storage devices.

Moreover, it is to be appreciated that various components described herein (e.g., detection components, input components, sample delivery components, and the like) can include electrical circuit(s) that can include components and circuitry elements of suitable value in order to implement the aspects of this innovation(s). Furthermore, it can be appreciated that many of the various components can be implemented on one or more integrated circuit (IC) chips. In one exemplary implementation, a set of components can be implemented in a single IC chip. In other exemplary implementations, one or more of respective components are fabricated or implemented on separate IC chips.

What has been described above includes examples of the implementations of the present invention. It is, of course, not possible to describe every conceivable combination of components or methodologies for purposes of describing the claimed subject matter, but it is to be appreciated that many further combinations and permutations of this innovation are possible. Accordingly, the claimed subject matter is intended to embrace all such alterations, modifications, and variations that fall within the spirit and scope of the appended claims. Moreover, the above description of illustrated implementations of this disclosure, including what is described in the Abstract, is not intended to be exhaustive or to limit the disclosed implementations to the precise forms disclosed. While specific implementations and examples are described herein for illustrative purposes, various modifications are possible that are considered within the scope of such implementations and examples, as those skilled in the relevant art can recognize.

In particular and in regard to the various functions performed by the above described components, devices, circuits, systems and the like, the terms used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the claimed subject matter. In this regard, it will also be recognized that the innovation includes a system as well as a computer-readable storage medium having computer-executable instructions for performing the acts and/or events of the various methods of the claimed subject matter.

The aforementioned systems/circuits/modules have been described with respect to interaction between several components/blocks. It can be appreciated that such systems/circuits and components/blocks can include those components or specified sub-components, some of the specified components or sub-components, and/or additional components, and according to various permutations and combinations of the foregoing. Sub-components can also be implemented as components communicatively coupled to other components rather than included within parent components (hierarchical). Additionally, it should be noted that one or more components may be combined into a single component providing aggregate functionality or divided into several separate sub-components, and any one or more middle layers, such as a management layer, may be provided to communicatively couple to such sub-components in order to provide integrated functionality. Any components described herein may also interact with one or more other components not specifically described herein but known by those of skill in the art.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than or equal to 11" can include any and all sub-ranges between (and including) the minimum value of zero and the maximum value of 11, that is, any and all sub-ranges having a minimum value of equal to or greater than zero and a maximum value of equal to or less than 11, e.g., 1 to 5. In certain cases, the numerical values as stated for the parameter can take on negative values.

In addition, while a particular feature of this innovation may have been disclosed with respect to only one of several implementations, such feature may be combined with one or more other features of the other implementations as may be desired and advantageous for any given or particular application. Furthermore, to the extent that the terms "includes," "including," "has," "contains," variants thereof, and other similar words are used in either the detailed description or the claims, these terms are intended to be inclusive in a manner similar to the term "comprising" as an open transition word without precluding any additional or other elements.

Reference throughout this specification to "one implementation," or "an implementation," means that a particular feature, structure, or characteristic described in connection with the implementation is included in at least one implementation. Thus, the appearances of the phrase "in one implementation," or "in an implementation," in various places throughout this specification are not necessarily all referring to the same implementation. Furthermore, the particular features, structures, or characteristics may be combined in any suitable manner in one or more implementations.

Further, references throughout this specification to an "item," or "file," means that a particular structure, feature or object described in connection with the implementations are not necessarily referring to the same object. Furthermore, a "file" or "item" can refer to an object of various formats.

As used in this application, the terms "component," "module," "system," or the like are generally intended to refer to a computer-related entity, either hardware (e.g., a circuit), a combination of hardware and software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. While separate components are depicted in various implementations, it is to be appreciated that the components may be represented in one or more common component. Further, design of the various implementations can include different component placements, component selections, etc., to achieve an optimal performance. Further, a "device" can come in the form of specially designed hardware; generalized hardware made specialized by the execution of software thereon that enables the hardware to perform specific function (e.g., media item aggregation); software stored on a computer readable medium; or a combination thereof.

Moreover, the words "example" or "exemplary" are used herein to mean serving as an example, instance, or illustration. Any aspect or design described herein as "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

What is claimed is:

1. A system facilitating selecting components for aviation engines, comprising:
   a memory that stores computer executable components;
   a processor, operably coupled to the memory, and that executes computer executable components stored in the memory, wherein the computer executable components comprise:
   a calculation component that calculates standard deviation between components for the aviation engines based on a statistical distribution of measured manufacturing characteristics;
   a selection component that selects a subset of components based on the calculated standard deviation and trades among the selected subset of components as a function of similarity based on a normal statistical distribution to introduce variation into the selected subset of components; and
   an analysis component that analyzes the subset of components at respective standard deviation to determine a standard deviation and period of time for trading that maximizes durability performance, wherein the trading results in kits of components, each kit of the kits comprising components comprising common life expectancies.

2. The system of claim 1, further comprising a machine learning component that employs artificial intelligence to learn the standard deviation between the components enabling building of one or more models of the subset of components to automatically generate the standard deviation and the period of time for trading that maximizes durability performance.

3. The system of claim 2, wherein the machine learning component performs a utility-based analysis that factors benefits associated with selecting one subset of components over another subset components.

4. The system of claim 1, wherein the subset of components is within minimum and maximum limits for total blade airflow.

5. The system of claim 1, wherein the subset of components is based at least in part on thermal barrier coating thickness, blade airflow and wall thickness.

6. The system of claim 1, wherein the selection component trades between the subset of components having one standard deviation.

7. The system of claim 1, wherein the selection component trades between the subset of components having two standard deviations.

8. The system of claim 1, further comprising a preventative maintenance component that predicts maintenance schedule based on the standard deviation.

9. The system of claim 1, wherein the variation comprises tailored variation.

10. A computer-implemented method, comprising:
    calculating, by a system operatively coupled to a processor, standard deviation between components for aviation engines based on a statistical distribution of measured manufacturing characteristics;

selecting, by the system, a subset of components based on the calculated standard deviation;

trading, by the system, among the selected subset of components as a function of similarity based on a normal statistical distribution to introduce variation into the selected subset of components; and analyzing, by the system, the subset of components at respective standard deviation to determine a standard deviation and period of time for trading that maximizes durability performance, wherein the trading results in kits of components, each kit of the kits comprising components comprising common life expectancies.

11. The computer-implemented method of claim 10, further comprising employing artificial intelligence to learn the standard deviation between the components enabling building of one or more models of the subset of components to automatically generate the standard deviation and the period of time for trading that maximizes durability performance.

12. The computer-implemented method of claim 10, wherein the subset of components is based at least in part on thermal barrier coating thickness, blade airflow and wall thickness.

13. The computer-implemented method of claim 10, wherein the trading comprises trading between the subset of components having one standard deviation.

14. The computer-implemented method of claim 10, wherein the trading comprises trading between the subset of components having two standard deviations.

15. The computer-implemented method of claim 10, further comprising predicting maintenance schedule based on the standard deviation.

16. The computer-implemented method of claim 10, wherein the variation comprises tailored variation.

17. A computer program product for facilitating selecting components for aviation engines, the computer program product comprising a computer readable storage medium having program instructions embodied therewith, the program instructions executable by a processor to cause the processor to:

calculate standard deviation between components for the aviation engines based on a statistical distribution of measured manufacturing characteristics;

select a subset of components based on the calculated standard deviation;

trade among the selected subset of components as a function of similarity based on a normal statistical distribution to introduce variation into the selected subset of components; and analyze the subset of components at respective standard deviation to determine a standard deviation and period of time for trading that maximizes durability performance, wherein the trading results in kits of components, each kit of the kits comprising components comprising common life expectancies.

18. The computer program product of claim 17, wherein the program instructions are further executable to cause the processor to:

employ artificial intelligence to learn the standard deviation between the components enabling building of one or more models of the subset of components to automatically generate the standard deviation and the period of time for trading that maximizes durability performance.

19. The computer program product of claim 17, wherein the program instructions are further executable to cause the processor to:

predict maintenance schedule based on the standard deviation.

20. The computer program product of claim 17, wherein the variation comprises tailored variation.

* * * * *